United States Patent [19]

Saku et al.

[11] Patent Number: 4,628,488
[45] Date of Patent: Dec. 9, 1986

[54] SEMICONDUCTOR MEMORY DEVICE WITH A REFRESH MECHANISM

[75] Inventors: Koji Saku, Kawasaki; Fumio Horiguchi, Itabashi, both of Japan

[73] Assignee: Tokyo Shibaura Denki Kabushiki Kaisha, Kawasaki, Japan

[21] Appl. No.: 565,815

[22] Filed: Dec. 27, 1983

[30] Foreign Application Priority Data

Dec. 27, 1982 [JP] Japan .................................. 57-226705

[51] Int. Cl.$^4$ .............................................. G11C 7/00
[52] U.S. Cl. .................................. 365/222; 365/195; 365/230
[58] Field of Search ............... 365/189, 195, 222, 230, 365/236

[56] References Cited

U.S. PATENT DOCUMENTS

3,811,117  5/1974  Anderson, Jr. ..................... 365/222

*Primary Examiner*—James W. Moffitt
*Attorney, Agent, or Firm*—Oblon, Fisher, Spivak, McClelland & Maier

[57] ABSTRACT

A semiconductor memory device with a refresh mechanism having a plurality of memory cells integrated on a semiconductor substrate, a plurality of word lines and digit lines each connected to the memory cells, a refresh control circuit for successively selecting the word lines and refreshing the memory cells word line by word line in a refresh period and a time constant circuit connected to the word lines. The time constant circuit is activated whenever the word line connected to it is selected during an access period and emits a "refresh not required" signal until a predetermined time has elapsed. The refresh control circuit receives the "refresh not required" signal and then acts so as to skip the refreshing operation.

10 Claims, 9 Drawing Figures

SEMICONDUCTOR MEMORY DEVICE WITH A REFRESH MECHANISM

BACKGROUND OF THE INVENTION

1. Field of the Invention:

The present invention relates to a semiconductor memory device with a refresh mechanism such as a memory device consisting of dynamic memory cells, and more particularly to a semiconductor memory device with an improved refresh mechanism.

Figure 1:
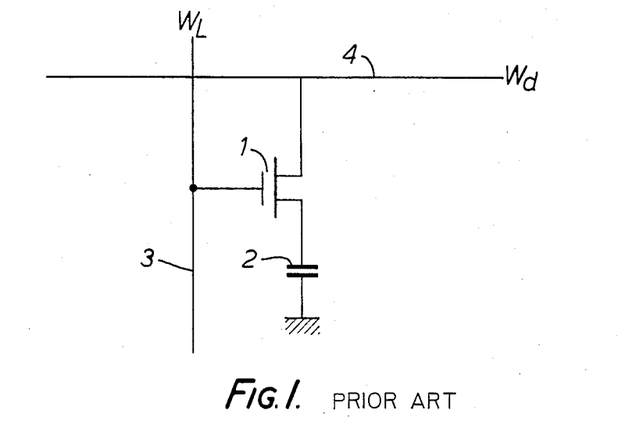
FIG. 1 is a circuit diagram showing the layout of a memory cell.
Figure 2:
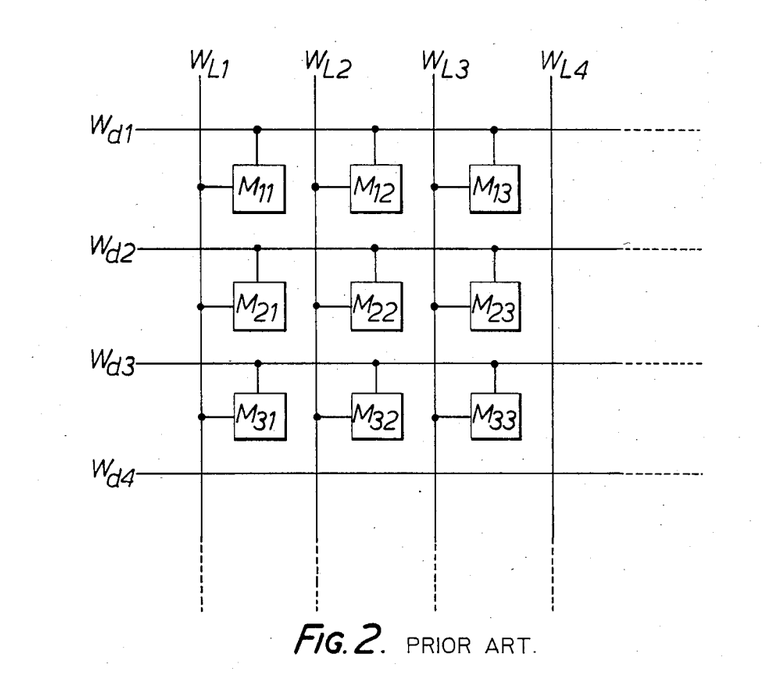
FIG. 2 is a schematic diagram of the layout of a dynamic RAM using the above-mentioned memory cell.

2. Description of the Prior Art:

Various types of semiconductor memory with a rewrite facility have come into use of late, with the most common one being the memory cell illustrated in FIG. 1, consisting of one MOS transistor 1 and one MOS capacitor 2. In this memory cell, the gate of the MOS transistor 1 is connected to the word line 3, while the drain is connected to the digit line 4, and the storage data is stored in the MOS capacitor 2 in the form of an electric charge. When a memory device, e.g. a dynamic random access memory (RAM), is formed from memory cells of this kind, these memory cells M are connected at the intersections of a plurality of word lines WL and a plurality of digit lines Wd arranged in matrix form, as shown in FIG. 2.

In a dynamic RAM constructed in this way, data is stored as described above in the form of an electric charge, but some time after writing in the data the charge stored in the MOS capacitor 2 is lost because of leakage current, etc. if the data is left, after being written into the MOS capacitor 2, until a read-out is required, the charge stored in the MOS capacitor 2 may become distorted. Also, the charge stored in the MOS capacitor 2 can be increased or decreased by soft errors. "Soft errors" here means distortion of the data stored in the capacitor of the memory cell or faulty action of the sense amplifier, due to invasion of the diffusion layer of the memory cell or bit line by $\alpha$- rays absorbed in minute amounts by the package and semi-conductor substrate.

In the case of a dynamic RAM, therefore, provision has been made hitherto for a refresh period every 2 msec, during which access is not possible. During this period, the data stored in the MOS capacitor 2 is rewritten for all bits—it is, in short, refreshed. Usually, a refresh control circuit is used when this refresh operation takes place which selects each word line in succession and refreshes the memory cells word line by word line.

However, this kind of conventional memory device involves the following problem. Because the word lines selected during the access period were also thereby refreshed, this practice of refreshing all the bits on all the word lines during the refresh period meant that word lines not yet requiring to be refreshed were refreshed twice in succession. These unnecessary refresh operations increased the consumption of electric current, and were also inconvenient in that they made it impossible to shorten the refresh period, during which data could not be accessed.

SUMMARY OF THE INVENTION

Accordingly, an object of the present invention is to provide a semiconductor memory device whereby word lines selected during the access period and therefore not requiring to be refreshed are not selected during the refresh period, and whereby also the consumption of electric power during the refresh period is reduced and the refresh period itself can be shortened.

The core of the invention is that a time constant circuit, activated by the selection of a word line during the access period, is connected to each word line, and that on the basis of the information emitted by these time constant circuit, only those word lines requiring to be refreshed are selected during the refresh period.

In other words, according to the present invention, a semiconductor memory device with a refresh mechanism, in which a plurality of memory cells each consisting of one transistor and one capacitor are integrated in matrix form on a semiconductor substrate, is provided with time constant circuits connected to a plurality of word lines connected individually to the above-mentioned memory cells. Each of these time constant circuits, when activated by the selection during the access period of the associated word line, emits a "refresh not required" signal until a predetermined time has elapsed. There is provided also a refresh control circuit which refreshes the memory cells word line by word line, selecting these word lines in succession, but selecting only those word lines connected to time constant circuits which do not emit the "refresh not required" signal, during the refresh period.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS

Figure 3:
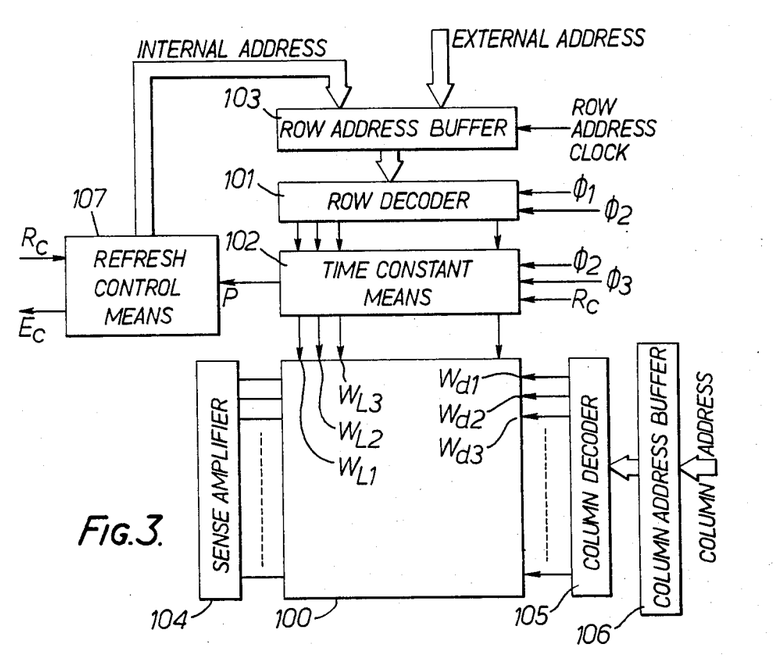
FIG. 3 is a block diagram showing in schematic form the layout of the main parts of an embodiment of the present invention.

Referring now to the drawings, wherein like reference numerals designal identical or corresponding parts throughout the several views, and more particularly to FIG. 3 thereof, which illustrates the block diagram of the present invention.

Reference numeral 100 in FIG. 3 shows dynamic memory cells in which a plurality of memory cells M are integrated on a semiconductor substrate and are arranged in matrix form. Each cell is consists of one MOS transistor and one MOS capacitor in the same manner as shown in FIG. 1. These memory cells M are connected at the intersections of a plurality of word lines WL and a plurality of digit lines Wd.

The word lines WL are connected to a row decoder 101 through a time constant means 102. The row decoder 101 is further connected to a row address buffer 103. The row address is supplied to the row address buffer 103 to select the word lines WL. The row address consists of two kinds of addresses, i.e., external address and internal address. One of these addresses is selectively supplied to the row address buffer 103 by a switching mechanism. The row address clock is supplied to the row address buffer 103, and the signals $\phi_1$ and $\phi_2$ are supplied to the row decoder 101. A signal $\phi_2$ is also supplied to the time constant means 102 along with signals $\phi_3$ and Rc. The time constant means 102 emits a signal P which indicates that a refresh is not necessary in a refresh period.

A sense amplifier 104 and a column decoder 105 are connected to the digit lines Wd. A column buffer 106 to which a column address is supplied, is connected to the column decoder 105.

Reference numeral 107 shows a refresh control means which controls the supply of the internal address which is used for a refresh of the memory cells in a refresh period. This control is carried out by detecting the signal P. Further, the refresh control means 107 is activated by receiving the signal Rc, and emits a signal Ec when the refresh period is completed.

Figure 4:
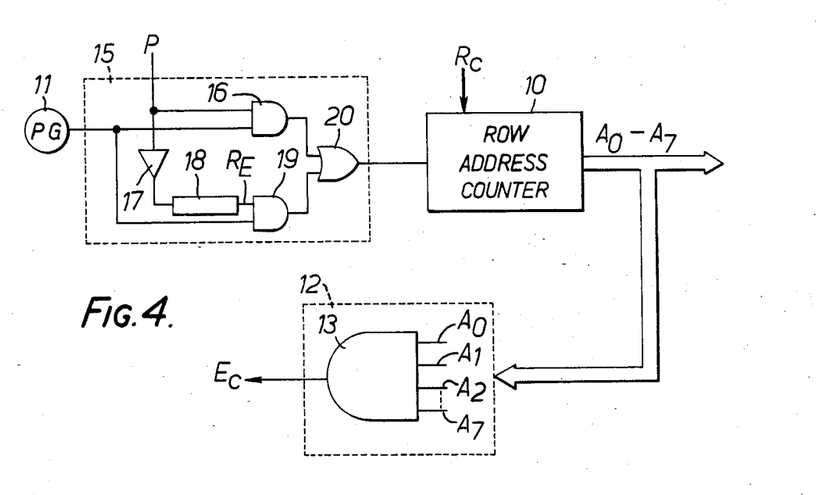
FIG. 4 is a circuit diagram showing a refresh control means shown in FIG. 3.

FIG. 4 shows a circuit diagram of the refresh control means 107. In this figure, reference numeral 10 is a row address counter. The counter 10 is reset by the refresh clock Rc and incremented by 1 on receipt of a pulse from a pulse generator 11. As a result, the counter 10 supplies the internal address of, for example 8 bits, according to the count data. The internal address signal is also applied to a first circuit 12 consisting of a parallel circuit of a plurality of AND gates 13. This first circuit 12 detects when the data stored in the address counter 10 exceed the highest available address, and emits the signal Ec. Namely, when all bits of the internal address are "1", the first circuit 12 emits the signal "1", for example. This signal Ec shows that the refresh period is over, and the access period will then be started.

The refresh control means also has a second circuit 15. This second circuit 15 consists of an AND gate 16, NOT gate 17, a time delay circuit 18, AND gate 19 and OR gate 20. The pulse signal from the pulse generator 11 is supplied to the AND gates 16 and 19, and the signal P is supplied to AND gate 15 and NOT gate 17. As a result, when the signal P is "1", the pulses from the pulse generator 11 are supplied to the row address counter 10 through AND gate 16 and OR gate 20 in order to increment by 1 the data in the counter 10. On the other hand, when the signal P is "0", the incrementation of the row address counter 10 is not carried out because AND gate 16 is closed. A delay time of the delay circuit 18 is so predetermined that the incrementation of the address counter 10 is stopped until refreshing of a word line is completed. Namely, when the signal P is "0", that is, when a refresh of its word line is necessary, the signal P is converted to "1" by NOT gate 17, and then delayed by the delay circuit 18. A signal which is delayed at a predetermined time is supplied to AND gate 19 as a signal RE which indicates the completion of refreshing.

The time delay circuit 18, NOT gate 17, AND gate 19 and OR gate 20 can be eliminated when the signal RE is obtained in another method. For example, the signal RE can be obtained in the signals of a so-called row address clock chains.

An explanation follows of a device constructed as described above, referring to the flow-chart shown in FIG. 5. First, when the refresh clock Rc is applied to the row address counter 10 —(a), the address counter 10 is reset —(b), and the address counter 10 is incremented by 1—(c). Next, the first circuit 12 checks whether or not the highest available address has been exceeded —(d). If it has been exceeded, the signal Ec, signaling that the refresh period has been completed, is generated by the first circuit 12, and the access period is entered —(e). If the highest available address has not been exceeded, a test is performed to establish whether or not the word line corresponding to the address is required to be refreshed —(f). If the signal P is "1", that is, if refreshing is not required, the sequence returns to (c), and the address counter 10 is once again incremented by 1. If the signal P is "0", that is, if refreshing is required, the incrementation of the address counter 10 is stopped —(g), and the word line corresponding to the address is refreshed —(h). After completion of the refresh of this word line, the sequence returns to (c), namely, the pulse from the pulse generator 11 is supplied to the address counter 10 through AND gate 19 and OR gate 20, with the address counter 10 being incremented by 1, and the operation described above is then repeated.

Figure 5:
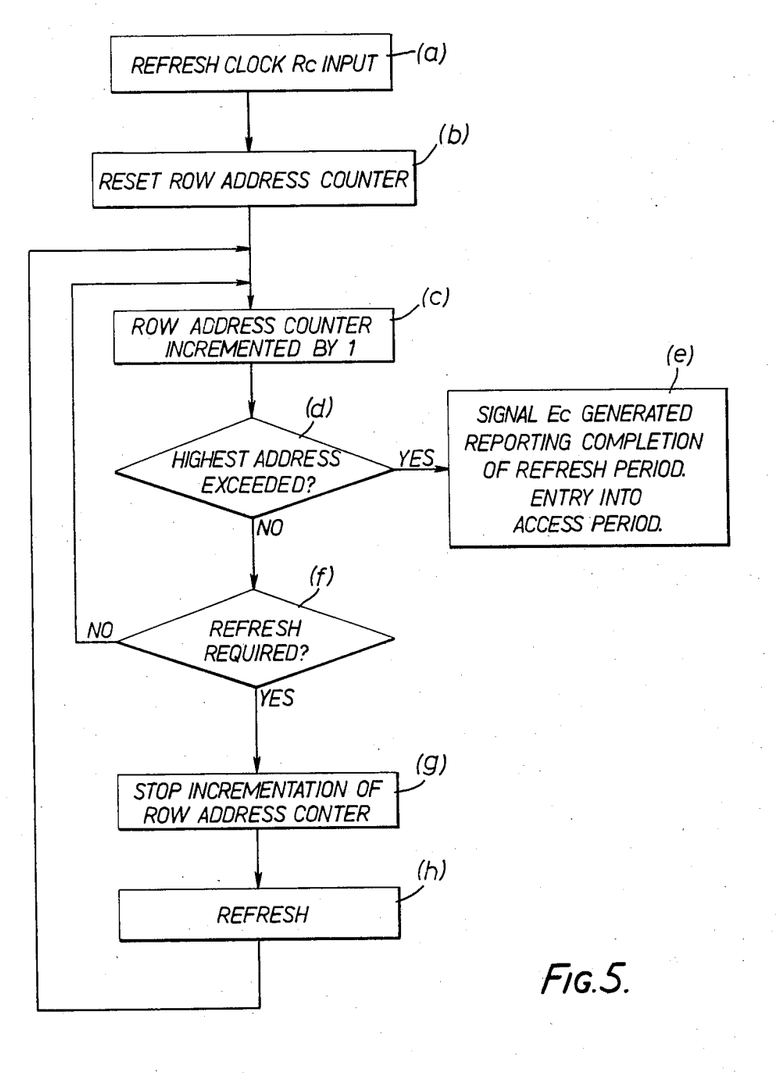
FIG. 5 is a flow-chart explaining the working of the embodiment shown in FIG. 3.

The time taken for the sequence (c)–(g) described above is shorter than the time taken to refresh one word line because the pulse generator 11 generates pulses at intervals shorter than the time taken to refresh one word line, and refreshing a word line previously accessed is thus skipped quickly. This means that the time taken to refresh a word line previously accessed in a conventional device is not substantially necessary in the present invention, and thus it is possible to shorten the refresh period.

Figure 6:
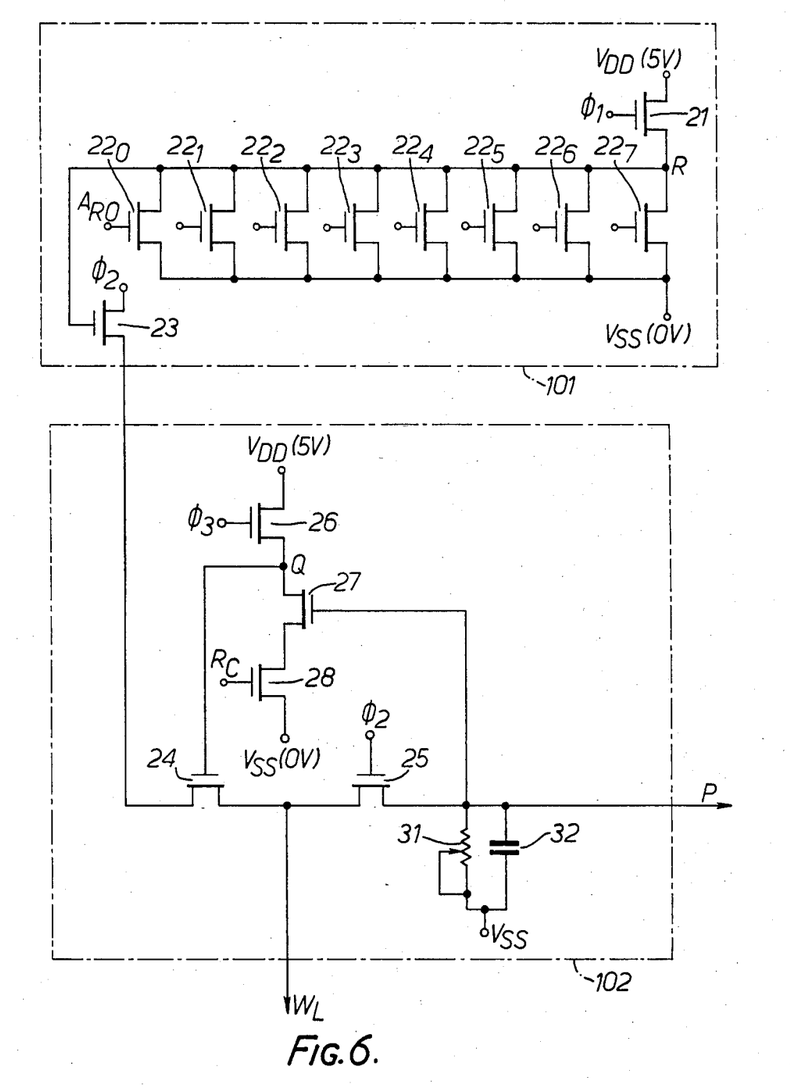
FIG. 6 is a circuit diagram showing the layout of a row decoder and a time constant means shown in FIG. 3.

FIG. 6 is a circuit diagram showing the row decoder 101 and the time constant means 102 shown in FIG. 3. The diagram depicts one word line only, as the layout is the same for all word lines. A MOS transistor 21, MOS transistors $22_0$–$22_7$ connected in parallel and a MOS transistor 23 are connected in series to form a decoder. A source electrode of the transistor 21 is connected to a voltage source $V_{DD}$ (for example, 5 Volts), and the pulse signal $\phi_1$ is supplied to a gate electrode of the transistor 21. Drain electrodes of the transistors $22_0$–$22_7$ are connected to a voltage source $V_{SS}$ (for example, 0 Volts). The pulse $\phi_2$ is supplied to a source electrode of the transistor 23. If the pulse signal $\phi_1$ is high and address input signals $A_{R0}$–$A_{R7}$ are low, the voltage potential of point R becomes high. This means that this word line is selected by the decoder 101. The output signal of the decoder is supplied to the transistor 23.

The time constant means 102 consists of MOS transistors 24–28 and a parallel circuit of a variable resistor 31 and a capacitor 32. The source electrode of the transistor 24 is connected to a drain electrode of the transistor 23 and the drain electrode of the transistor 24 is connected to a source electrode of the transistor 25. The gate electrode of the transistor 24 is connected to interconnecting point of the transistors 26 and 27. The drain electrode of the transistor 25 and the gate electrode of the transistor 27 are connected to the parallel circuit of the resistor 31 and the capacitor 32. The voltage $V_{DD}$ is supplied to the source electrode of the transistor 26, a pulse signal $\phi_2$ to the gate electrode of the transistor 25 and a pulse signal $\phi_3$ to the gate electrode of the transistor 26. The transistors 27 and 28 are connected in series, the refresh clock signal $R_C$ is supplied to the gate electrode of the transistor 28. A word line $W_L$ is connected to the interconnecting point of the transistors 24 and 25.

Figure 7:
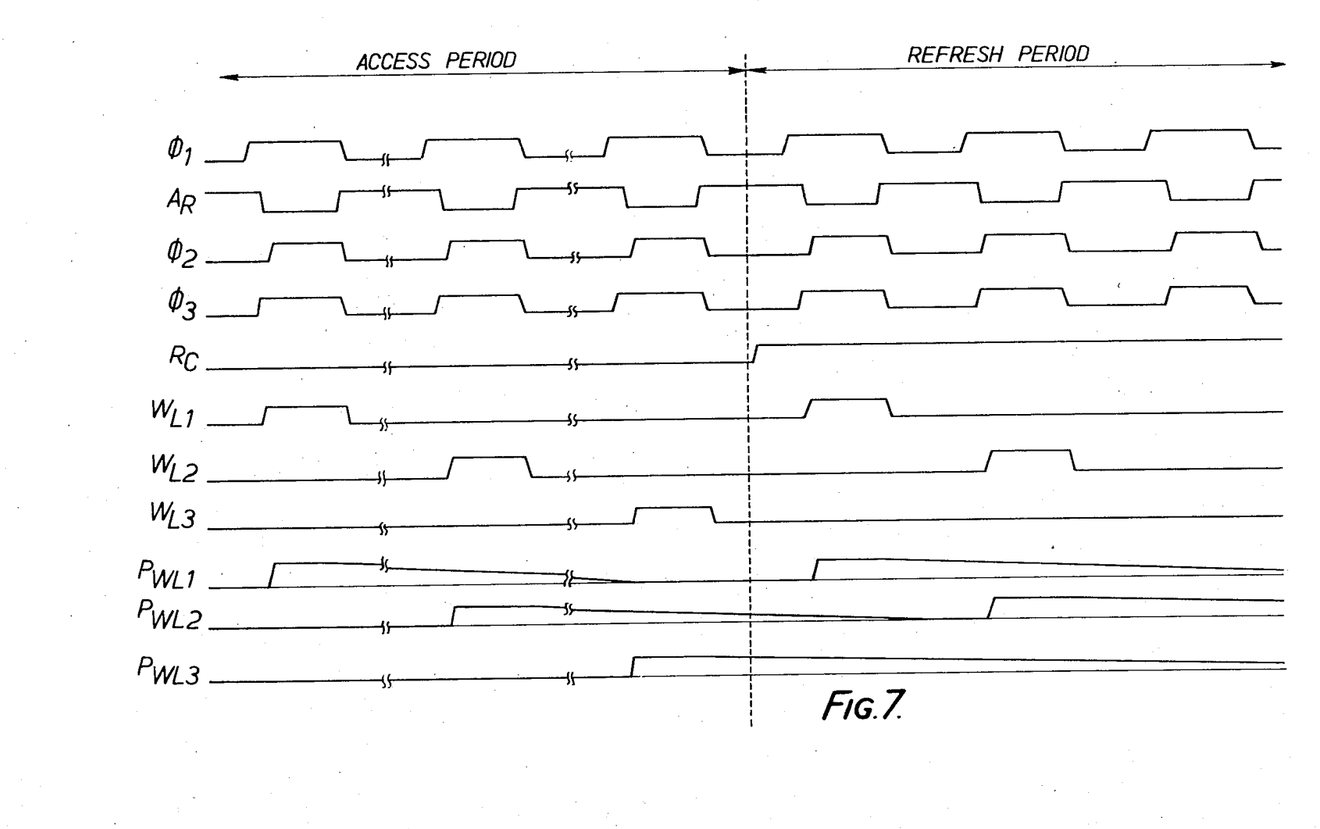
FIG. 7 is a signal waveform chart explaining the working of the circuit shown in FIG. 6.

An explanation follows of the working of the circuit described above, reeferring to the timing chart shown in FIG. 7. During an access cycle, the point R is first precharged by the clock $\phi_1$. Then, address input signals $A_R$ ($A_{R0}$–$A_{R7}$) are supplied. If the address input signals $A_R$ are low and clocks $\phi_2$ and $\phi_3$ are then supplied, transistors 23-26 turns on. As a result, the refreshing of the selected word line is started. FIG. 7 shows that three word lines $WL_1$, $WL_2$, and $WL_3$ are selected for refreshing, the capacitor 32 is also charged to the "high" potential. The capacitor 32 is discharged, via the resistor 31, when the clock $\phi_2$ goes low. Consequently, the potential at point I gradually alters from "high" to "low". The time constant of the discharge is determined by the product CR of the resistance R of the resistor 31 and the capacitance C of the capacitor 32, and can be set to suit certain requirements such as the maximum permitted refresh intervals, in order to select the resistance value.

FIG. 7 shows the potentials $P_{WL1}$, $P_{WL2}$ and $P_{WL3}$, corresponding to the word lines $WL_1$, $WL_2$ and $WL_3$, respectively.

During the refresh cycle, when the refresh clock $R_C$ goes high, the transistor 28 switches on. If the potential P is still "high", the transistor 27 is also on the potential at point Q becomes low. Hence the transistor 24 will stay off even when the clocks $\phi_1$, $\phi_2$ and $\phi_3$ go high, and the word line stays low. The result is, therefore, that there is no refreshing of the word line corresponding to the address. In such a circumstance, the signal P ("1") is supplied to the refresh control means 107, and the incrementation of the row address counter 10 is carried out.

If however a fixed time after the charging of the capacitor 32 has elapsed, the potential at point P becomes "low". When the potential at point P is low, the transistor 27 switches off and the potential at point Q becomes "high" when the clock $\phi_3$ goes high. In such a circumstance, the row address counter 10 in the refresher control means 107 is not incremented, and the word line corresponding to the address is refreshed.

FIG. 7 shows the case in which the word line $W_{L3}$ is not refreshed because the potential $P_{WL3}$ is still "high".

As described above, when the potential at point P is high during the refresh period, that is to say, in the event that the clocks $\phi_1$, $\phi_2$ and $\phi_3$ go high when refreshing is not required with respect to that word line, a pulse emitted from the pulse generator 11 is supplied to the row address counter 10 to increment it by 1. By this means, a word line not requiring refreshing is not selected during the refresh period.

Thus, in this embodiment, by setting at an appropriate value for the RC time constant, refreshing of the word line, which was not selected during the refresh period because of previous access, can be effected in the next refresh period before the data in the memory cells connected to those word lines becomes distorted. The electric power consumption needed for one refresh operation can therefore be reduced, and the refresh period shortened.

Figures 8, 9:
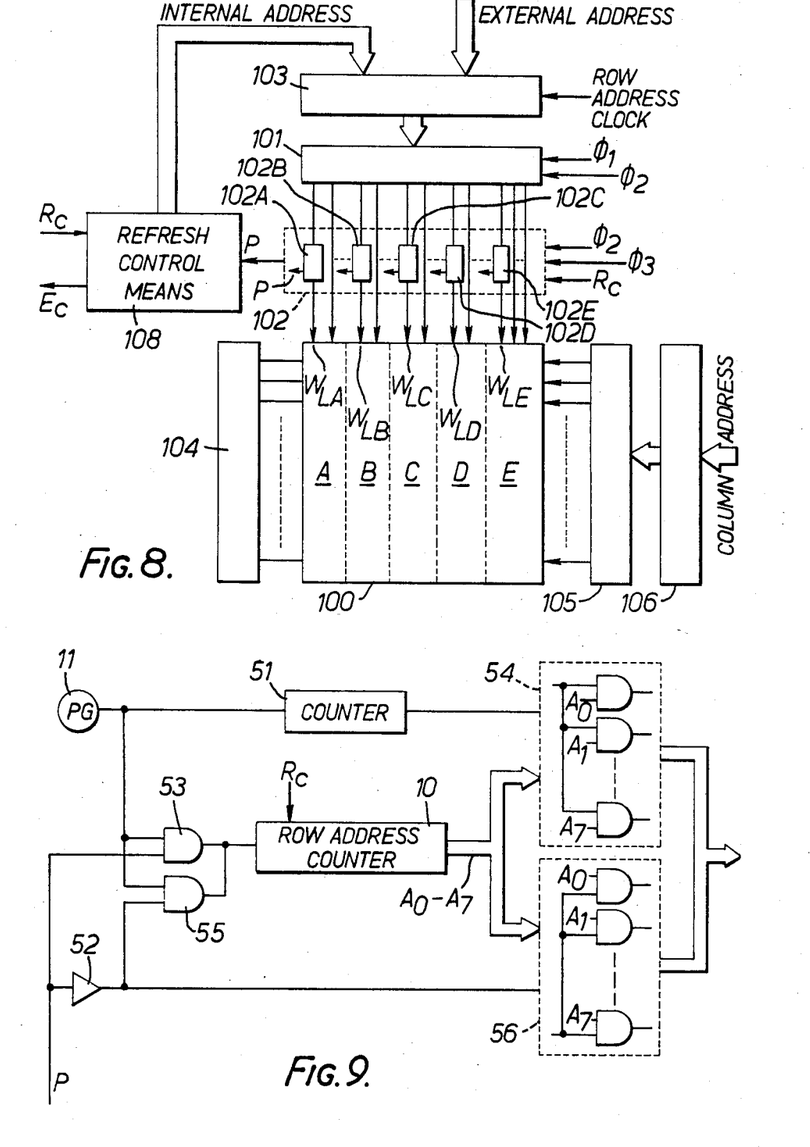
FIG. 8 is a block diagram showing in schematic form the layout of the main parts of another embodiment of the present invention.
FIG. 9 is a circuit diagram showing the main parts of a refresh control means shown in FIG. 8.

FIG. 8 shows another embodiment of the present invention. In this embodiment the memory cells are divided into a plurality of blocks A–E, and the refresh is carried out from block to block. One block corresponds to fifty word lines, for example, and the time constant means $102_A$–$102_E$, the configuration of which is the same as that shown in FIG. 6, is respectively connected only to the first word lines $WL_A$–$WL_E$ of each block. Refresh circuits are also connected to the remaining word lines. If the time constant means connected to the first word line $WL_A$ of the block A emits the signal P indicating the refresh is not required, all word lines in the block A are unconditionally skipped. If the time constant means connected to the first word line of the block A detects that the refresh is necessary, all word lines in the block A are sequentially selected and refreshing is carried out word line by word line.

FIG. 9 is a current diagram showing the main part of a refresh control means 108 used to establish the above-mentioned operation. The refresh control means 108 consists of a row address counter 10, a pulse generator 11, a counter 51, NOt gate 52, AND gates 53 and 55 and AND gate circuits 54 and 56. The counter 51 emits a pulse for every fifty pulses from the pulse generator 11, and supplies the output signal to AND gate 54. Assuming now that the signal P emitted from the time constant means connected to the first word line $WL_A$ of block A is "high", AND gate 53 opens, and then the row address counter 10 is incremented by the pulses from the pulse generator 11. When the row address counter 10 is incremented by fifty, the counter 51 emits the output signal, and therefore the output from the row address counter at this time is transferred to the row address buffer 103 through AND gate circuit 54. When the signal P is "low", the signal P is converted to "high" by NOT gate 52. The output signal of the NOT gate 52 is supplied to AND gates 55 and AND gate circuit 56. Therefore, the row address counter 10 is incrmented by the pulses from the pulse generator 11, and each address corresponding to the address counter 10 is sequentially transferred to the row address buffer 103 through AND gate circuit 56.

As described above, according to the second embodiment of the present invention, the same effects as that described in the former embodiment can be obtained, when the dynamic memory is used especially for a data transfer apparatus or a static image treatment apparatus.

This invention is not restricted to the embodiments described above. For example, the time constant means referred to above is not confined to the means in which a resistor and a capacitor are connected in parallel. All that is necessary is that it should be activated by the selection of the word line in an access period, and that its output should alter in one direction or after a given period of time. Further, the refresh control means is not confined to the layout described above and illustrated by FIGS. 4 and 9, but may be varied as appropriate.

Obviously, numerous modifications and variations of the present invention are possible in light of the above teachings. It is therefore to be understood that that within the scope of the appended claims, the invention may be practiced otherwise than as specifically described herein.

What is claimed as new and desired to be secured by a letters patent of the United States is:

1. A semiconductor memory device with a refresh mechanism comprising:
   a plurality of memory cells each consisting of one transistor and one capacitor which are integrated on a semiconductor substrate;
   a plurality of word lines for addressing said memory cells;
   a plurality of digit lines for reading and/or writing the data of said memory cells;

an access control means for accessing said memory cells by selecting said word lines;

a refresh control means for successively selecting said word lines connected to each of said memory cells and refreshing said memory cells word line by word line in a refresh period; and a time constant means connected to each of said word lines which is activated whenever the word line connected to it is selected during an access period and which supplies a "refresh not required" signal until a first predetermined time has elapsed to said refresh control means in said refresh period, wherein said refresh control means includes a pulse generator, a row address counter for successively selecting said word line by pulse signals from said pulse generator, a first circuit means for detecting the data in said row address counter and emitting a pulse signal indicating the end of said refresh period when said data indicates that the maximum row address has been exceeded, and a second circuit means for incrementing said row address counter by 1 when said "refresh not required" signal is supplied from said time constant means and stopping an incrementation of said row address counter for a second predetermined time period when said "refresh not required" signal is not supplied from said time constant means.

2. A semiconductor memory device according to claim 1, wherein said time constant means includes,
a capacitor for charging an electric charge and being activated by the selection of said word line,
a resistor connected in parallel to said capacitor for discharging said electric charge in said capacitor with the time constant of the product CR of the resistance R of said resistor and the capacitance C of said capacitor.

3. A semiconductor memory device according to claim 2, wherein said time constant of the product CR is variable.

4. A semiconductor memory device according to claim 1, wherein said transistor is a MOS transistor, the gate of which is connected to said word line and the drain of which is connected to said digit line.

5. A semiconductor memory device according to claim 1, wherein said capacitor is a MOS capacitor which stores the data for storage in the form of an electric charge.

6. A semiconductor memory device with a refresh mechanism comprising:
a plurality of memory cells integrated on a semiconductor substrate;
a plurality of word lines and a plurality of digit lines each connected to said memory cells and arranged in matrix form;
a refresh control means for successively selecting said word lines connected to each of said memory cells and refreshing said memory cells word line by word line in a refresh period;
a time constant means connected to each word line which is activated whenever the word line connected to it is selected during an access period and which emits a "refresh not required" signal until a predetermined time has elapsed;

whereby said refresh control means selects in said refresh period only those word lines connected to said time constant means which do not emit said "refresh not required" signal, wherein said refresh control means includes a pulse generator, a row address counter for successively selecting said word lines by pulse signals from said pulse generators, a first circuit means for detecting the data in said row address counter and emitting a pulse signal indicating the end of said refresh period when said data indicates the maximum number of rows of said matrix has been exceeded, and a second circuit means for incrementing said row address counter by 1 when said "refresh not required" signal is supplied from said time constant means and stopping an incrementation of said row address counter for a second predetermined time when said "refresh not required" signal is not supplied from said time constant means wherein said refresh control means, in response to said "refresh not required" signal supplies a next row address signal so as to skip the access of the word line which is connected to the memory cell refresh during said access period.

7. A semiconductor memory device according to claim 6, wherein said plurality of memory cells consist of random access memory cells.

8. A semiconductor memory device according to claim 6, wherein the term of said "refresh not required" signal from said time constant means is determined by the product CR of the resistance R of a resistor and the capacitance C of a capacitor.

9. A semiconductor memory device according to claim 8, wherein said resistor is a variable resistor.

10. A semiconductor memory device with a refresh mechanism comprising:
a plurality of memory cells integrated on a semiconductor substrate and divided into a plurality of blocks;
a plurality of word lines and a plurality of digit line each connected to said memory cells and arranged in matrix form;
a refresh control means for selecting said word lines connected to said memory cells and for refreshing said memory cells block by block in a refresh period;
a time constant means connected to each first word line of each of said blocks which is activated whenever said first word line connected to it is selected during an access period and which emits a "refresh not required" signal until a predetermined time has elapsed;

whereby said refresh control means selects in said refresh period all of the word lines in the block in which the first word line is connected to said time constant means which do not emit said "refresh not required" signal and wherein said refresh control means includes a circuit for supplying row address signals corresponding only to the first word lines of the next block when said time constant means emits said "refresh not required" signal.

* * * * *